United States Patent
Keating et al.

(10) Patent No.: US 7,145,085 B2
(45) Date of Patent: Dec. 5, 2006

(54) ENHANCED CONNECTION ARRANGEMENT FOR CO-PLANAR VERTICAL SURFACE MOUNTING OF SUBASSEMBLIES ON A MOTHER BOARD

(75) Inventors: David Keating, Limerick (IE); Antoin Russell, Limerick (IE); Thomas H. Templeton, Jr., Fremont, CA (US); Mysore Purushotham Divakar, San Jose, CA (US)

(73) Assignee: Power One, Inc., Grand Cayman (KY)

( * ) Notice: Subject to any disclaimer, the term of this patent is extended or adjusted under 35 U.S.C. 154(b) by 0 days.

(21) Appl. No.: 10/972,488

(22) Filed: Oct. 21, 2004

(65) Prior Publication Data

US 2006/0086522 A1 Apr. 27, 2006

Related U.S. Application Data

(63) Continuation-in-part of application No. 10/716,134, filed on Nov. 18, 2003, now Pat. No. 6,815,614.

(60) Provisional application No. 60/500,404, filed on Sep. 5, 2003.

(51) Int. Cl.
*H05K 5/00* (2006.01)
(52) U.S. Cl. .................. 174/520; 361/788; 361/786; 361/741
(58) Field of Classification Search ............. 174/521, 174/520; 361/788, 786, 741, 720, 721
See application file for complete search history.

(56) References Cited

U.S. PATENT DOCUMENTS

| | | | | |
|---|---|---|---|---|
| 5,781,414 A | * | 7/1998 | Mills et al. ................. | 361/786 |
| 5,872,701 A | * | 2/1999 | Hayden et al. ............. | 361/786 |
| 6,487,086 B1 | * | 11/2002 | Ikeda ........................ | 361/772 |
| 6,496,376 B1 | * | 12/2002 | Plunkett et al. ............ | 361/729 |
| 6,504,730 B1 | * | 1/2003 | Cooney et al. ............. | 361/826 |
| 6,538,899 B1 | * | 3/2003 | Krishnamurthi et al. .... | 361/788 |
| 6,608,762 B1 | * | 8/2003 | Patriche ..................... | 361/788 |
| 6,633,490 B1 | * | 10/2003 | Centola et al. ............. | 361/785 |

* cited by examiner

*Primary Examiner*—Hung V. Ngo
(74) *Attorney, Agent, or Firm*—Polster, Lieder, Woodruff & Lucchesi, L.C.

(57) ABSTRACT

The invention provides a subassembly to facilitate co-planar vertical surface mounting of subassembly boards. By "vertically mounting" is meant that a subassembly circuit board with a major surface is mounted perpendicular to the major surface of a circuit motherboard. In accordance with the invention, a subassembly for co-planar vertical surface mounting comprises a subassembly board coupled between a pair of base headers. Advantageously one base header comprises a plurality of mounting lugs secured to a transverse element in a co-planar configuration. The other base header conveniently comprises a plurality of connector pins secured to an elongated header element in co-planar configuration. The two headers interlock with the board to provide connection and co-planar support. Edge metallization of the subassembly board can provide enhanced thermal or electrical connection to the underlying portions of one or more lugs.

6 Claims, 6 Drawing Sheets

ENHANCED CONNECTION ARRANGEMENT FOR CO-PLANAR VERTICAL SURFACE MOUNTING OF SUBASSEMBLIES ON A MOTHER BOARD

CROSS REFERENCE TO RELATED APPLICATIONS

This application is a continuation-in-part of U.S. application Ser. No. 10/716,134 filed by the present inventors on Nov. 18, 2003 now U.S. Pat. No. 6,815,614, which is incorporated herein by reference. The '134 application in turn, claims the benefit of U.S. Provisional Application Ser. No. 60/500,404, "Arrangement For Co-Planar Vertical Surface Mounting Of Subassemblies On A Mother Board", filed Sep. 5, 2003, which is also incorporated by reference.

FIELD OF THE INVENTION

This invention relates to subassemblies to facilitate vertically mounting electrical devices, such as subassembly printed circuit boards, to other electrical devices, such as printed circuit motherboards.

BACKGROUND OF THE INVENTION

Electronic systems are becoming faster, denser in the number of components, and increasingly complex. Increasing density typically requires greater current which, in turn, requires low resistance interconnection and effective heat dissipation. Higher speed and larger currents require low inductance. Increasing complexity often requires that subassembly boards be mounted and connected onto system boards ("motherboards"). The available space for subassemblies is often limited to narrow strips of board rather than large areas and this in turn limits the choice of subassembly package. Typically subassemblies are connected to system boards by conventional PTH (Plated Through Hole) technology. This technology involves connecting either a vertical or horizontal board to a system board by inserting pins protruding from the subassembly into holes in the system board. The pins are then soldered to secure the subassembly to the system board. Horizontal boards can be mounted to system board by standard SMT (Surface Mount Technology). This involves connecting gull wing leads, "J" leads or a solder ball (BGA) leads by SMT reflow. Vertical subassemblies are normally mounted by PTH technology.

Both the subassemblies and the mother boards are typically printed circuit boards comprised of insulating substrates supporting patterns of conductive leads, mounting pads and circuit components. Such assemblies are now quickly manufactured by a surface mount technology that can precisely place components on mounting pads and efficiently connect them by solder reflow.

Surface mount assembly works well with small components. However subassemblies can be relatively large in area compared with individual components, and in connecting one printed circuit board (e.g. a subassembly board) to another (e.g. the mother board) can present issues of co-planarity. If the two printed circuit boards are not sufficiently co-planar, mounting pads may not touch and solder reflow will not connect. In addition, larger area devices typically require expensive specialized pick-and-place equipment to assemble on motherboards in high volume.

Accordingly, there is a need for improved arrangements to vertically mount subassembly boards using surface mount technology.

SUMMARY OF THE INVENTION

The invention provides a subassembly to facilitate co-planar vertical surface mounting of subassembly boards. By "vertically mounting" is meant that a subassembly circuit board with a major surface is mounted perpendicular to the major surface of a circuit motherboard. In accordance with the invention, a subassembly for co-planar vertical surface mounting comprises a subassembly board coupled between a pair of base headers. Advantageously one base header comprises a plurality of mounting lugs secured to a transverse element in a co-planar configuration. The other base header conveniently comprises a plurality of connector pins secured to an elongated header element in co-planar configuration. The two headers interlock with the board to provide connection and co-planar support. Edge metallization of the subassembly board can provide enhanced thermal or electrical connection to the underlying portions of one or more lugs.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
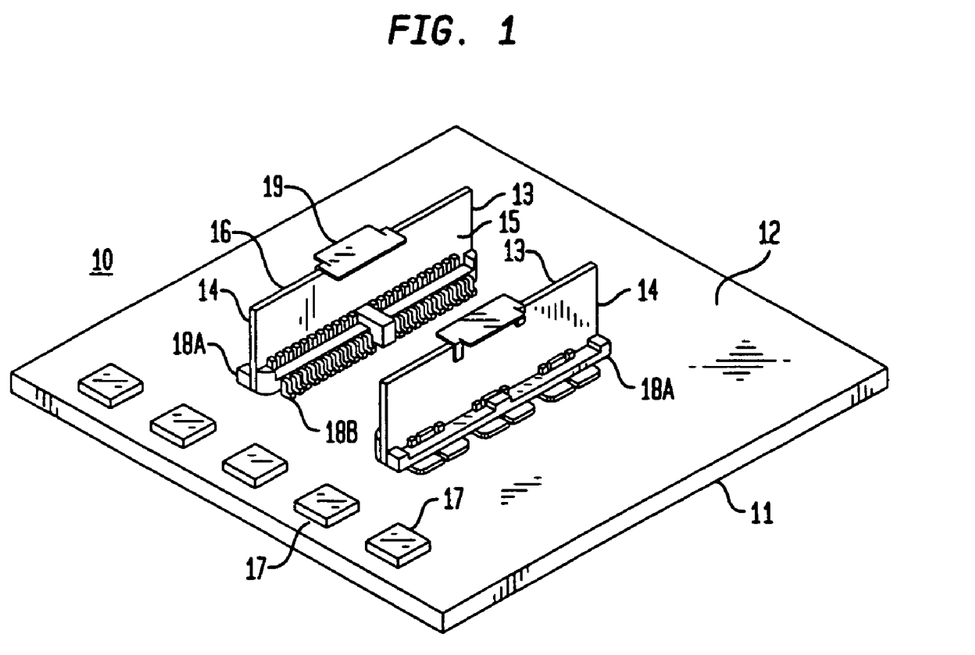
FIG. 1 is a perspective view showing a system circuit board having subassembly circuit boards vertically connected to it.

Referring to the drawings, FIG. 1 is a perspective view of a connected circuit assembly 10 comprising a first circuit device 11 having a generally planar major surface 12 and one or more (here two) vertically mounted subassemblies 13 having a subassembly board 14 major surfaces 15 and edges 16. The first circuit device 11 can for example, be a system board (mother board). Each board device 11, 14 will typically comprise a printed circuit board having substantially planar major surfaces that bear mounting pads and adherent conductive leads (not shown) and a plurality of electrical components 17 such as integrated circuits, resistors, capacitors or inductors. The circuit boards are typically comprised of insulating PC boards that may include one or more internal conductive layers.

If the subassembly board 14 were connected to the first circuit device 11 with the major surfaces parallel, the subassembly board 14 would occupy a relatively large area on the surface of device 11. Moreover, if the devices were printed circuit boards and were to be connected using conventional surface mount technology, co-planarity would be an issue, as mounting pads must be in contact for reliable connection by solder reflow.

Rather than connecting the devices with their major surfaces parallel, the present inventors contemplate that the subassembly board 14 will be connected with its major surface(s) perpendicular to the major surface of device 11, and they provide subassembly components to facilitate such perpendicular (vertical) connection compatible with surface mount fabrication of the assembly 10. Specifically, they provide the subassembly board 14 with a pair of base headers 18A, 18B to permit vertical mounting and, conveniently, a pickup cap 19, to permit pick and place positioning of the subassembly.

Figure 2:
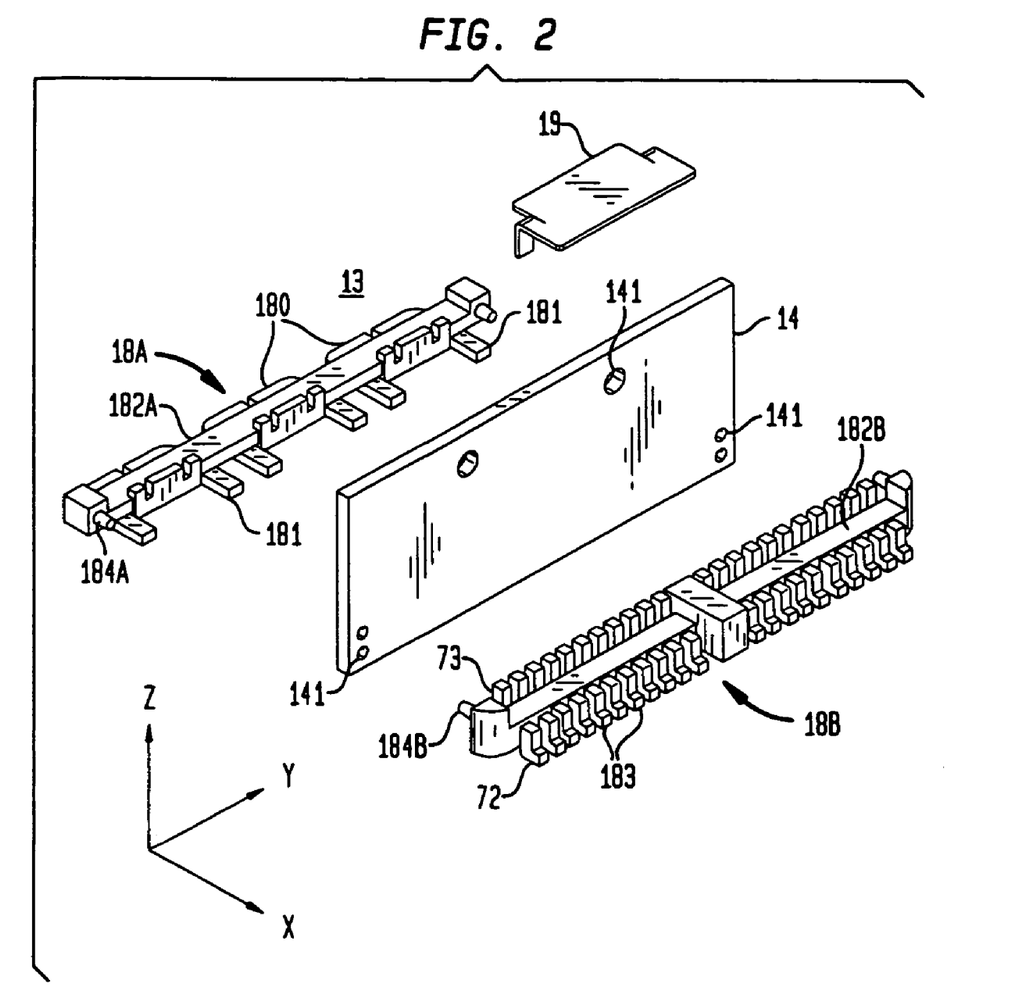
FIG. 2 is an exploded view showing the components of an exemplary subassembly.

FIG. 2 is an exploded view showing the components of an advantageous embodiment of a subassembly 13 comprising subassembly board 14, a support base header 18A, a multiple pin base header 18B and a pickup cap 19.

With reference to the coordinate system shown in FIG. 2, board 14 has its major surfaces in the yz plane and it is contemplated that it will be vertically mounted on a motherboard having a major surface in the xy plane. The base headers 18A, 18B are coupled to the board 14 along the edge adjacent the motherboard. The headers typically have a length along board 14 greater than their transverse dimension perpendicular to the board, e.g. the header y dimension is typically greater than the x dimension and typically co-extensive with the subassembly board edge.

The base header 18A advantageously comprises a plurality of metal support lugs 180 (better shown in FIG. 4) each having a pair of protruding support arms 181. The lugs are attached to a longitudinal element 182A in co-planar relationship, e.g. the bottom surfaces of each lug 180 will be co-planar with the motherboard surface on the xy plane. The attachment is advantageously achieved by molding the lugs 180 into a polymer element 182A. The arms 181 conveniently support board 14.

Figure 7:
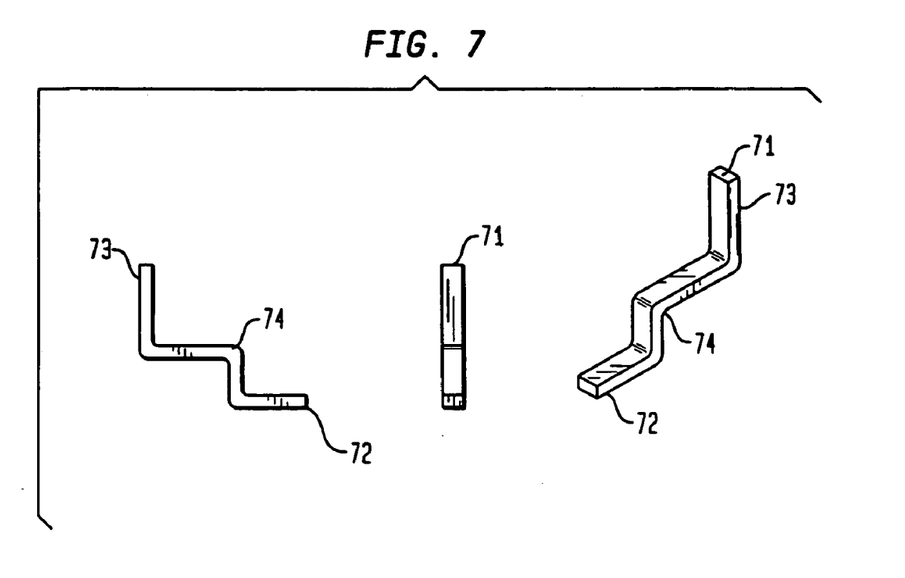
FIG. 7 presents three views of an advantageous connector pin.

The base header 18B advantageously comprises a plurality of metal connector pins 183 (better shown in FIG. 7). Advantageously each connector pin 183 comprises a short conductive metal rod 71 having a bent configuration defining a bottom contact surface 72 for contacting the board 11 and a lateral contact surface 73 perpendicular to surface 72 for contacting subassembly board 14. An intermediate bend 74 facilitates attachment to element 182B. The pins are attached to a longitudinal element 182B in co-planar relationship. The bottom surfaces 72 of the pins are advantageously co-planar on the xy plane. Here also the attachment is conveniently achieved by molding into a polymer element 182B. Alternatively the second base header 18B can include lugs 180 and be similar to header 18A.

Figure 3A:
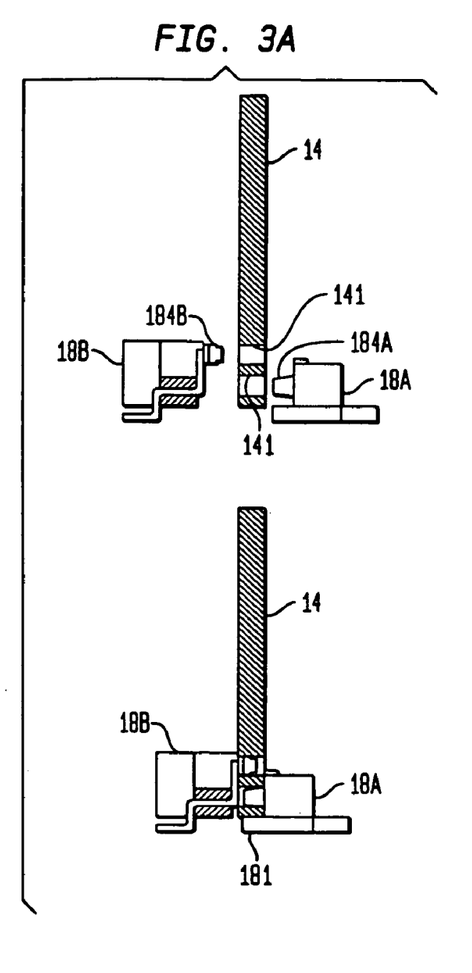
FIGS. 3A and 3B illustrate arrangements for registering and coupling the headers with the assembly board.

The base headers 18A and 18B are adapted for coupling onto boards 11 and 14. Advantageously the headers are manufactured with protruding regions 184A, 184B (pips) projecting toward the board 14 in registration with correspondingly dimensioned receiving apertures 141 in the board. The pips are inserted into the apertures 141 when the header is placed on the subassembly, and the pips act as locators for the headers in relation to the other header placed on the opposite side of the subassembly as illustrated in FIG. 3A, if the projecting pips 184A, 184B are vertically displaced (in the z direction).

Figure 3B:
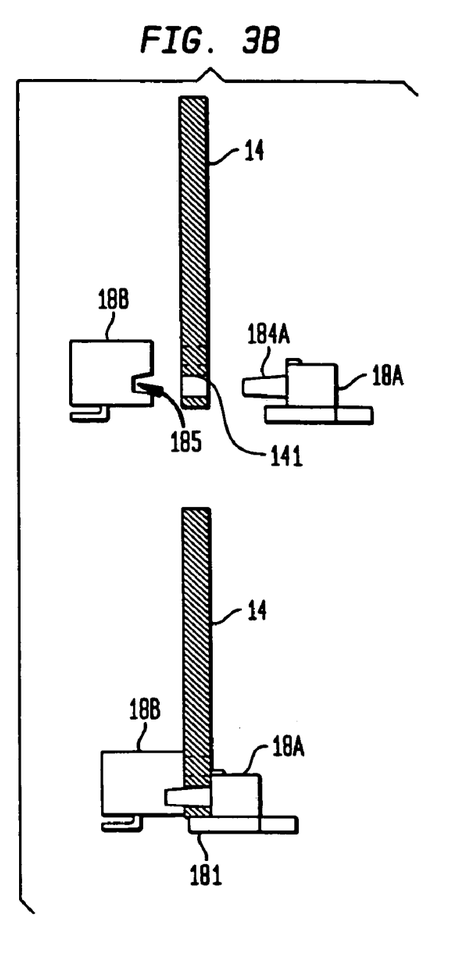

Alternatively, as illustrated in FIG. 3B, one header, e.g. 18A, could have a set of protruding pips 184A and the other header could have a set of receiving sockets 185 dimensioned and registered for receiving pips 184A. The male header 18A could then be placed onto the subassembly board 14 and reflowed. The female header could then be placed onto the subassembly with the socket section interlocking with the male section, ensuring co-planarity between the two headers.

Figure 4:
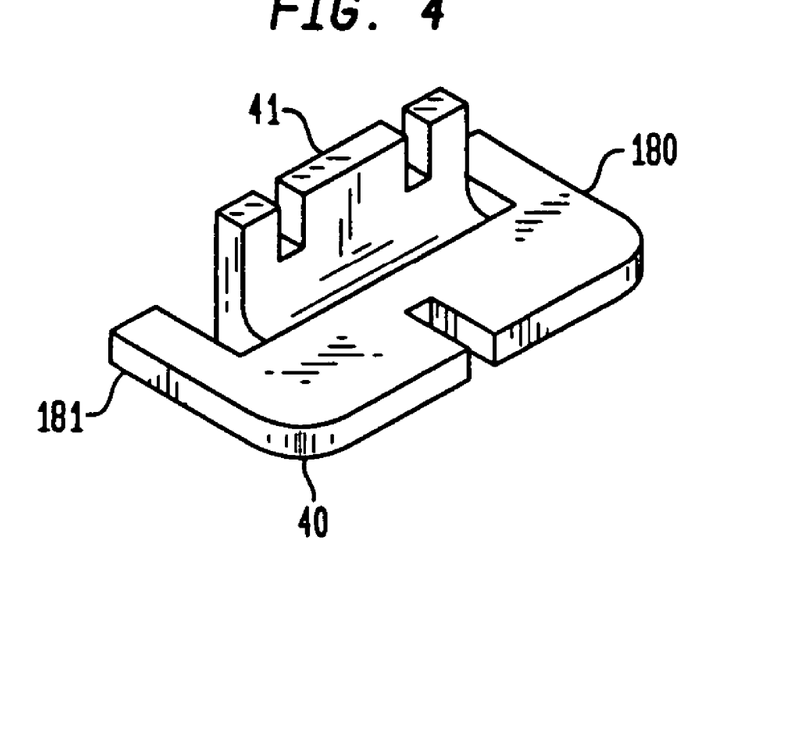
FIG. 4 shows an advantageous support lug.

FIG. 4 is an enlarged perspective view of an advantageous metal support lug 180 useful for vertically connecting the subassembly to the motherboard. The lug 180 is composed of a conductive body comprising a base section 40 and a transverse section 41.

The base section 40 can be a sheet of conductive material that is essentially planar in the xy-plane. The transverse section 41 is essentially planar in the yz plane perpendicular to the base section. The base section 40 advantageously has a width W in the y-direction greater than the extent w of the transverse section in the y-direction so that one or more arm portions 181 of the base section extend beyond the transverse section in the x-dimension. Thus the base section advantageously extends beyond the transverse section in front, behind (via arms 181) and on both sides, providing the transverse section with a firm foundation for mounting.

The lug 180 can be readily fabricated from a rectangular sheet of conductive material such as copper or copper alloy. A pair of cuts in the sheet separate the portion to become the transverse section 41 from the arms 181, and the transverse section can then be bent perpendicular to the sheet, leaving the remainder of the sheet as the base section 40. The resulting connector has arms 181 extending beyond the transverse section by a length that, in this instance, equals the height of the transverse section.

The connector is preferably provided with solderable surfaces for soldering onto system board mounting pads (not shown). Copper alloys such as phosphor bronze, beryllium copper or brass are advantageously plated with a thin layer of copper, nickel or gold, followed by solder, to enhance solderability.

The large form factors of the base and transverse sections provide paths with low inductance and low electrical and thermal resistance. Making the sections relatively thin with relatively large areas minimizes inductance and resistance.

Figure 5:
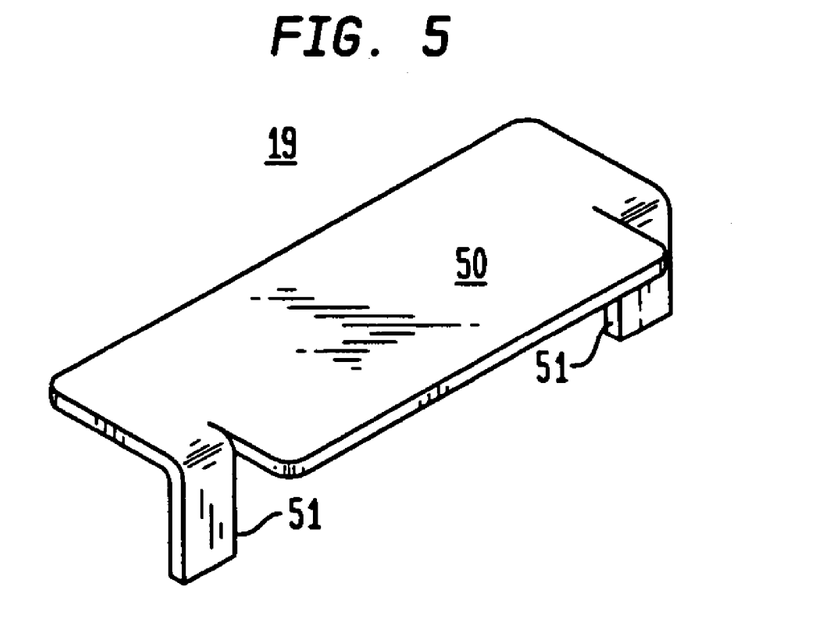
FIGS. 5 and 6 illustrate advantageous pick up caps.

FIG. 5 illustrates an optional pick up cap useful in surface mounting the subassembly board. To ensure the assembly can be picked and placed by conventional equipment without the need for special grippers, a pick up cap 19 can be placed on the subassembly. The main surface area 50 of the cap 19 is horizontal to the subassembly when the cap is placed into position. The cap 19 provides a sufficient surface area to permit the board 14 subassembly to be picked up and placed by conventional vacuum nozzle means. Vertical arms 51 can be used to attach the cap 19 to board 14. The cap 19 can be formed from any metal or alloy such as copper or brass. It can be plated with a surface finish that is conducive with reflow soldering. The cap 19 can be formed in such a way that it can be picked from tape and reel or trays and placed onto the subassembly. The cap is then secured on the subassembly as by the reflow process.

Figure 6:
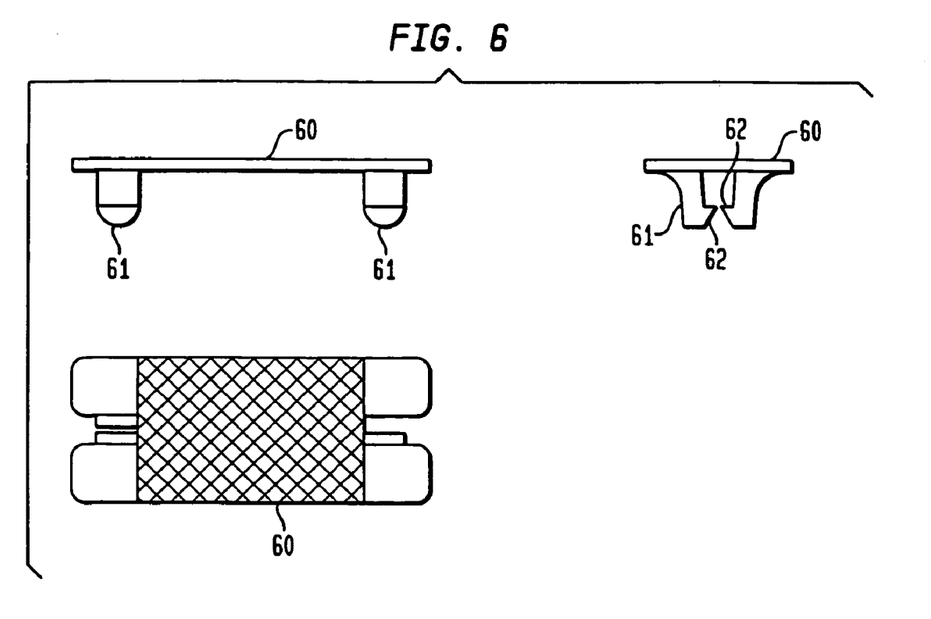

In an alternative embodiment shown in FIG. 6 the cap can be molded from a plastic compound. The compound should be of sufficiently high enough grade material to withstand the temperature extremes associated with reflowing surface mount devices. The cap 19 would have its main surface area 60 horizontal to the subassembly and provide sufficient surface area to pick and place the subassembly. The cap can also comprise a number of legs 61 that protrude perpendicular to the main pick up surface. The legs can be shaped at the ends so that they clip into a hole in the subassembly board 14. The legs are advantageously tapered at the ends to assist in the assembly of the cap and to avoid damage or stress during assembly. Each leg can have a lip 62 which acts as a grip when inserted into the hole in the assembly. The grip secures the cap in the place and prevents it from lifting off when the subassembly is being picked.

The combination of board, headers and cap are assembled into a subassembly which provides the means by which to pick and place the subassembly onto a system board with conventional pick and place equipment. The cap 19 provides the pick up point and the pins and lug headers or any combination of both provide a surface mountable, co-planar platform to place onto a system board. To further facilitate fabrication the vertical device can be placed on Tape and Reel equipment common in the electronics industry.

Figure 8:
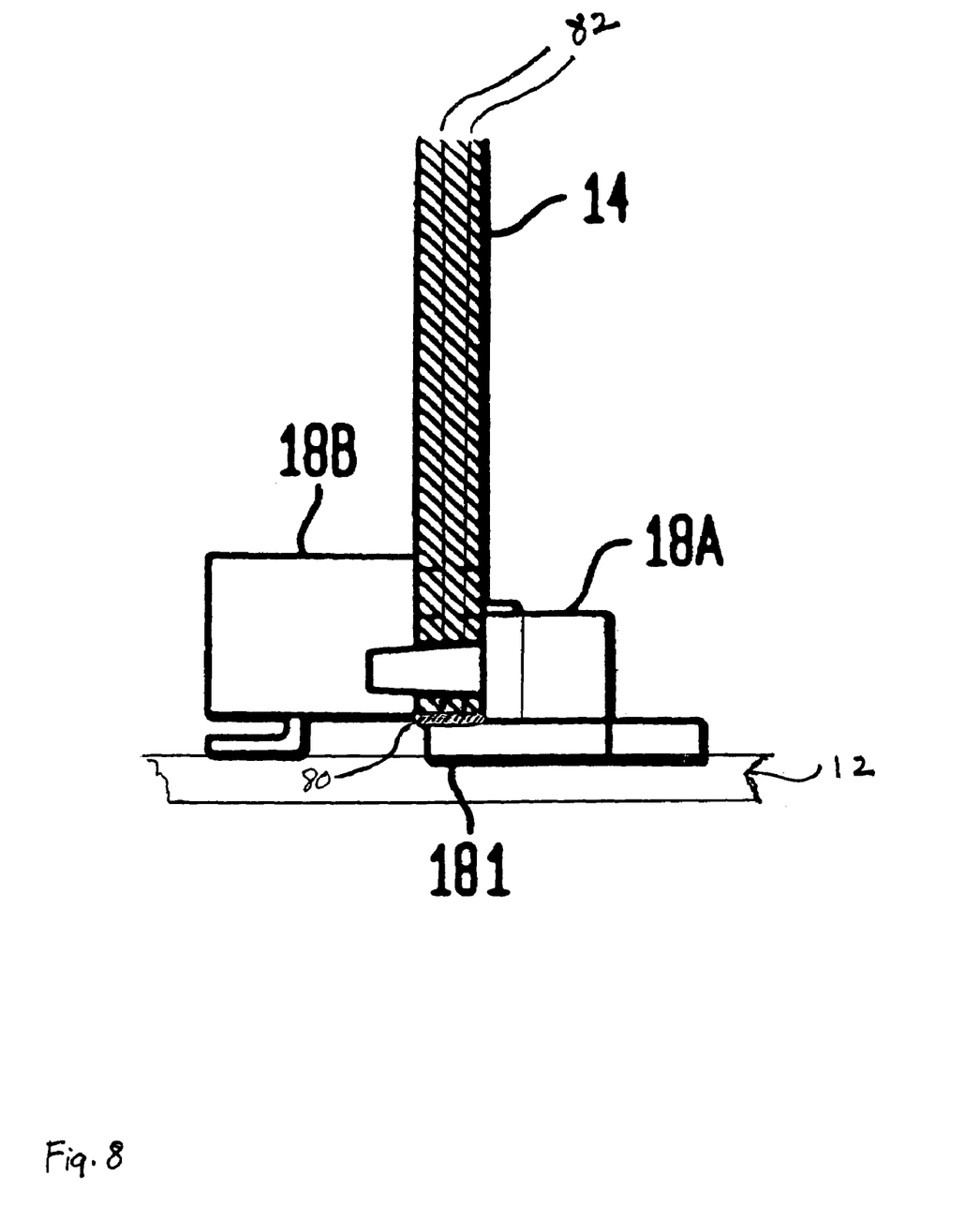
FIG. 8 illustrates an advantageous arrangement to enhance thermal or electrical connection between the vertical subassembly and a lug.

FIG. 8 illustrates an advantageous arrangement to enhance thermal or electrical connection between the vertical subassembly circuit board 14 and the lugs 180. The extension 181 of the lugs in the xy direction underneath the vertically mounted board 14 allows for connection of the lug extensions 181 to metallization 80 at the bottom edge of the board 14. Such metallization 80 may take the form of edge plating of board 14 or through hole plating of the board 14 followed by machining to expose the plating. If the subassembly board has inner conductive layers 82, then the metallization 80 permits direct metal-to-metal connection between inner layers of substrate 14 and the lugs and hence the system board 12 (motherboard). The connections can be for thermal and/or electrical conduction.

Thus it can be seen that one aspect of the invention includes a connected assembly of a system circuit board and a vertical mounted subassembly circuit board where the subassembly circuit board is vertically mounted on the system circuit board by a mounting arrangement comprising one or more metal lugs, each lug comprising a metal body having a generally planar section for connecting to the surface of the system board and a transverse section comprising a generally planar section substantially perpendicular to the base section for connecting to a major surface of the assembly board. The base section of each of the lugs includes one or more regions extending under the edge of the subassembly circuit board, and the edge of the subassembly board includes one or more regions of metallization for connection with one or more lug regions extending under the edge to provide thermal or electrical connection.

It is understood that the above-described embodiments are illustrative of only a few of the many possible specific embodiments, which can represent applications of the invention. Numerous and varied other arrangements can be made by those skilled in the art without departing from the spirit and scope of the invention.

What is claimed is:

1. A connected assembly of a system circuit board and a vertical mounted subassembly circuit board comprising:
   a system circuit board having at least one major surface;
   a subassembly circuit board having a pair of major surfaces, a first edge and an opposing second edge;
   the subassembly circuit board vertically mounted on the system circuit board by a mounting arrangement comprising one or more metal lugs, each lug comprising a metal body having a generally planar base section for connecting to the major surface of the system board and a transverse section comprising a generally planar section substantially perpendicular to the base section for connecting to a major surface of the subassembly board;
   the base section of each lug including one or more regions extending under the first edge of the subassembly circuit board; and
   the first edge of the subassembly circuit board including one or more regions of metallization for connection with one or more lug regions extending under the edge to provide thermal or electrical connection.

2. The connected assembly of claim 1 wherein the first edge metallization provides thermal connection to the lug.

3. The connected assembly of claim 1 wherein the first edge metallization provides electrical connection to the lug.

4. The connected assembly of claim 1 wherein the subassembly includes one or more interior conductive layers and the first edge metallization provides connection between the interior layers and the lug.

5. The connected assembly of claim 1 wherein the first edge metallization comprises edge plating.

6. The connected assembly of claim 1 wherein the first edge metallization comprises one or more exposed conductive through holes.

* * * * *

UNITED STATES PATENT AND TRADEMARK OFFICE
CERTIFICATE OF CORRECTION

PATENT NO. : 7,145,085 B2  
APPLICATION NO. : 10/972488  
DATED : December 5, 2006  
INVENTOR(S) : David Keating et al.

Page 1 of 1

It is certified that error appears in the above-identified patent and that said Letters Patent is hereby corrected as shown below:

On the title page, item [73]
please change assignee information to read as follows:

Power-One, Inc.
740 Calle Plano
Camarillo, CA 93012

Signed and Sealed this

Twenty-ninth Day of April, 2008

JON W. DUDAS
*Director of the United States Patent and Trademark Office*